(12) United States Patent
Yang et al.

(10) Patent No.: US 8,932,891 B2
(45) Date of Patent: Jan. 13, 2015

(54) METHOD FOR MANUFACTURING NITRIDE BASED SINGLE CRYSTAL SUBSTRATE AND METHOD FOR MANUFACTURING NITRIDE BASED SEMICONDUCTOR DEVICE

(75) Inventors: Jong In Yang, Kyungki-do (KR); Ki Yon Park, Choongchungbook-do (KR)

(73) Assignee: Samsung Electronics Co., Ltd., Seoul (KR)

( * ) Notice: Subject to any disclaimer, the term of this patent is extended or adjusted under 35 U.S.C. 154(b) by 846 days.

(21) Appl. No.: 11/492,009

(22) Filed: Jul. 25, 2006

(65) Prior Publication Data

US 2007/0082486 A1    Apr. 12, 2007

(30) Foreign Application Priority Data

Aug. 12, 2005    (KR) .................. 10-2005-0074246

(51) Int. Cl.
*H01L 21/00*    (2006.01)
*C30B 29/60*    (2006.01)
(Continued)

(52) U.S. Cl.
CPC .............. *C30B 29/60* (2013.01); *C30B 29/403* (2013.01); *H01L 21/6835* (2013.01); *H01L 21/6836* (2013.01); *H01L 21/78* (2013.01); *H01L 24/96* (2013.01); *H01L 33/0075* (2013.01); *H01L 33/0079* (2013.01); *H01L 2221/68327* (2013.01); *H01L 2221/68363* (2013.01); *H01L 2221/68368* (2013.01); *H01L 2924/01003* (2013.01);
(Continued)

(58) Field of Classification Search
CPC ...................... H01L 21/2007; H01L 21/76254

USPC .......................................... 438/47, 455–457; 257/E33.033–E33.035
See application file for complete search history.

(56) References Cited

U.S. PATENT DOCUMENTS 4,882,245 A * 11/1989 Gelorme et al. ................ 430/14
6,071,795 A * 6/2000 Cheung et al. ................ 438/458
(Continued)

FOREIGN PATENT DOCUMENTS

JP    07-030209    1/1995
JP    2003-162231    6/2003
(Continued)

OTHER PUBLICATIONS

Harrison, "Epoxy Resin @ 3Dchem.com," http://www.3dchem.com/molecules.asp?ID=326, Mar. 2007.*
(Continued)

*Primary Examiner* — Matthew Reames
(74) *Attorney, Agent, or Firm* — McDermott Will & Emery LLP (57) ABSTRACT

A method for manufacturing a nitride based single crystal substrate and a method for manufacturing a nitride based semiconductor device. The method for manufacturing the nitride based single crystal substrate includes forming a nitride based single crystal layer on a preliminary substrate; forming a polymer support layer by applying a setting adhesive material having flowability on the upper surface of the nitride based single crystal layer and hardening the applied adhesive material; and separating the nitride based single crystal layer from the preliminary substrate by irradiating a laser beam onto the lower surface of the preliminary substrate. The method for manufacturing the nitride based single crystal substrate is applied to the manufacture of a nitride based semiconductor device having a vertical structure.

5 Claims, 7 Drawing Sheets

(51) Int. Cl.
*C30B 29/40* (2006.01)
*H01L 21/683* (2006.01)
*H01L 21/78* (2006.01)
*H01L 23/00* (2006.01)
*H01L 33/00* (2010.01)

(52) U.S. Cl.
CPC ............... *H01L2924/01012* (2013.01); *H01L 2924/01013* (2013.01); *H01L 2924/01015* (2013.01); *H01L 2924/01027* (2013.01); *H01L 2924/01029* (2013.01); *H01L 2924/01033* (2013.01); *H01L 2924/01047* (2013.01); *H01L 2924/0106* (2013.01); *H01L 2924/01073* (2013.01); *H01L 2924/01079* (2013.01); *H01L 2924/01082* (2013.01); *H01L 2924/10329* (2013.01); *H01L 2924/01005* (2013.01); *H01L 2924/01006* (2013.01); *H01L 2924/01023* (2013.01)
USPC ..................................... 438/47; 257/E33.033

(56) References Cited

U.S. PATENT DOCUMENTS

| | | |
|---|---|---|
| 2003/0189212 A1 | 10/2003 | Yoo |
| 2004/0110395 A1 | 6/2004 | Ueda et al. |
| 2004/0140474 A1 | 7/2004 | Ueda et al. |
| 2004/0245543 A1* | 12/2004 | Yoo ............................... 257/103 |
| 2004/0248377 A1 | 12/2004 | Yoo et al. |
| 2005/0087747 A1 | 4/2005 | Yamada et al. |
| 2006/0148186 A1 | 7/2006 | Lee et al. |

FOREIGN PATENT DOCUMENTS

| | | |
|---|---|---|
| JP | 2003-303743 | 10/2003 |
| JP | 2003-347587 | 12/2003 |
| JP | 2004-047918 | 2/2004 |
| JP | 2005-079385 | 3/2005 |
| JP | 2005-206690 | 8/2005 |
| KR | 10-2004-0104232 A | 12/2004 |
| KR | 1020050000265 | 1/2005 |
| KR | 10-0483049 | 4/2005 |

OTHER PUBLICATIONS

Japanese Office Action issued in Japanese Patent Application No. JP 2006-211250 dated Dec. 8, 2009.

W.S. Wong et al., "Fabrication of thin-film InGaN light-emitting diode membranes by laser lift-off," Applied Physics Letters, vol. 75, No. 10, Sep. 6, 1999, pp. 1360-1362.

W.S. Wong et al., "Continuous-wave InGaN multiple-quantum-well laser diodes on copper substrates," Applied Physics Letters, vol. 78, No. 9, Feb. 26, 2001.

European Search Report issued in European Patent Application No. EP 06253864.0 dated Feb. 26, 2010.

Japanese Office Action, with English translation, issued in Japanese Patent Application No. 2006-211250, mailed Sep. 28, 2010.

Decision of Rejection, with English translation, issued in Japanese Patent Application No. 2006-211250, dated Aug. 2, 2011.

Decision to Decline Amendment, with English translation, issued in Japanese Patent Application No. 2006-211250, dated Aug. 2, 2011.

U.S. Office Action issued in U.S. Appl. No. 12/843,522 dated Aug. 13, 2013.

Japanese Office Action, and English translation thereof, issued in Japanese Patent Application No. 2011-25796 dated Mar. 13, 2012.

Office Action mailed Jun. 27, 2012 issued by the U.S. Patent Office in related U.S. Appl. No. 12/843,522.

US Office Action Issued in U.S. Appl. No. 12/843,522 dated Feb. 8, 2012.

\* cited by examiner

Laser Beam FIG. 2c

METHOD FOR MANUFACTURING NITRIDE BASED SINGLE CRYSTAL SUBSTRATE AND METHOD FOR MANUFACTURING NITRIDE BASED SEMICONDUCTOR DEVICE

CLAIM OF PRIORITY

This application claims the benefit of Korean Patent Application No. 2005-74246 filed on Aug. 12, 2005, in the Korean Intellectual Property Office, the disclosure of which is incorporated herein by reference.

BACKGROUND OF THE INVENTION

1. Field of the Invention

The present invention relates to a method for manufacturing a nitride based single crystal substrate and a method for manufacturing a nitride based semiconductor device, and more particularly to a method for manufacturing a nitride based single crystal substrate and a method for manufacturing a nitride based semiconductor device, which prevent yield reduction due to cracks generated in a laser lift-off process.

2. Description of the Related Art

Generally, III-V group nitride based semiconductors emit light of a wide range from visible rays to ultraviolet rays. These nitride based semiconductors are widely used as optical elements for emitting ultraviolet rays and a bluish green color ray.

In order to apply a nitride based semiconductor to a light emitting device, a technique of growing a high-definition single crystal thin film of the nitride based semiconductor is required. Generally, the nitride based single crystal thin film is grown on a substrate made of a different material, such as a sapphire ($Al_2O_3$) substrate or a silicon carbide (SiC) substrate, by a hetero-epitaxy method using metal organic chemical vapor deposition (MOCVD) and molecular beam epitaxy (MBE).

Although the nitride based single crystal is grown on the sapphire substrate, since a difference of lattice constants between gallium nitride and sapphire is approximately 13% and a difference of thermal expansion coefficients between gallium nitride and sapphire is −34%, stress is generated from an interface between the sapphire substrate and the gallium nitride single crystal. Accordingly, in order to grow a nitride based semiconductor device directly on a nitride based single crystal substrate, a freestanding nitride based single crystal substrate is required.

Figure 1:
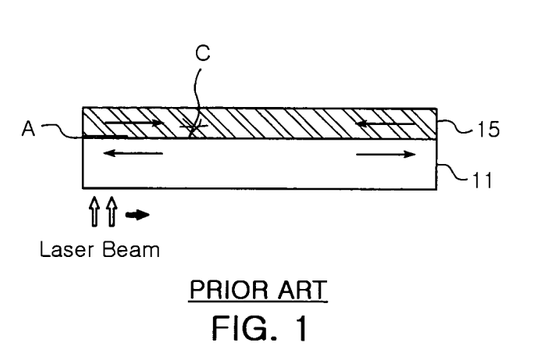
FIG. 1 is a schematic view for illustrating a conventional laser lift-off process for separating nitride based single crystal.

As shown in FIG. 1, the freestanding nitride based single crystal substrate is obtained by growing a nitride based single crystal 15 on a preliminary substrate 11, such as a sapphire substrate, and separating the nitride based single crystal 15 from the preliminary substrate 11 using a laser lift-off process. The laser lift-off process is performed by decomposing the nitride based single crystal 15 at an interface region with the sapphire substrate 11 into metal by irradiating a laser beam thereonto, and separating the metal from the preliminary substrate 11 by melting. Here, a portion of the nitride based single crystal 15, onto which the laser beam is irradiated, is decomposed into metal, i.e., gallium (Ga), and nitrogen ($½N_2$).

As disclosed in Korean Patent Registration No. 483049 (Title: method for manufacturing gallium nitride based light emitting device having vertical structure, Registrant: Samsung Electrics Co. Ltd., and Registration Date: Apr. 4, 2005), the laser lift-off process for separating the nitride based single crystal is used in the manufacture of a light emitting device having a vertical structure. That is, a method for manufacturing the nitride based light emitting device having a vertical structure is performed by bonding a permanent substrate to the upper surface of a nitride based light emitting structure formed on a preliminary substrate and separating the preliminary substrate and the nitride based light emitting structure from each other by the laser lift-off process.

However, the preliminary substrate is made of a material different from the nitride based light emitting structure, thus causing warpage and cracks (C) at the interface therebetween due to a difference of lattice constants and a difference of thermal expansion coefficients. Particularly, thermal stress due to the difference of thermal expansion coefficients severely occurs when the nitride based single crystal grown at a high temperature (900~1,200° C. is cooled to the room temperature for the laser lift-off process.

In order to solve the above problem, as disclosed in Korean Patent Application No. 2005-0000265 (Title: method and apparatus for manufacturing gallium nitride based single crystal substrate, Applicant: Samsung Electrics Co. Ltd., and Application Date: Jan. 3, 2005), the laser lift-off process is carried out while a high-temperature condition is maintained. However, this method requires specially designed deposition equipment.

Accordingly, a method for more simply solving problems caused by stress between a nitride based single crystal or a nitride based light emitting structure and a preliminary substrate made of a material different from the nitride based single crystal or light emitting structure has been required.

SUMMARY OF THE INVENTION

Therefore, the present invention has been made in view of the above problems, and it is an object of the present invention to provide a method for manufacturing a nitride based single crystal substrate, in which a support layer is formed by depositing a setting material having flowability and adhesiveness on a nitride based single crystal layer, thereby preventing the generation of cracks and warpage due to stress and being easily handled.

It is another object of the present invention to provide a method for manufacturing a nitride based light emitting device, in which a support layer is formed by depositing a setting material having flowability and adhesiveness on the nitride based light emitting device, thereby preventing the generation of cracks and warpage due to stress and being easily handled.

In accordance with one aspect of the present invention, the above and other objects can be accomplished by the provision of a method for manufacturing a nitride based single crystal substrate comprising forming a nitride based single crystal layer on a preliminary substrate; forming a polymer support layer by applying a setting adhesive material having flowability on the upper surface of the nitride based single crystal layer and hardening the applied adhesive material; and separating the nitride based single crystal layer from the preliminary substrate by irradiating a laser beam onto the lower surface of the preliminary substrate.

The method may further comprise removing the polymer support layer from the nitride based single crystal layer. The preliminary substrate is mainly made of sapphire, but is not limited thereto. That is, the preliminary substrate may be made of a material having an energy band gap larger than that of the nitride based single crystal layer. Because the used laser beam has a wavelength corresponding to a band gap, which is smaller than that of the preliminary substrate and larger than that of the nitride based single crystal layer. For example, the preliminary substrate is made of one material selected from the group consisting of sapphire, SiC, Si, $MgAl_2O_4$, MgO, $LiAlO_2$, and $LiGaO_2$.

The setting adhesive material may include at least one selected from the group consisting of a thermosetting resin, an ultraviolet-setting resin, and a naturally setting resin, which have a high adhesive strength with the nitride based single crystal layer. Preferably, the setting adhesive material is epoxy resin.

The applying of the setting adhesive material may be easily performed by spin coating or hand printing. In order to have a sufficient support function, the polymer support layer preferably has a thickness of more than 10 μm. In consideration of a subsequent handling process, the polymer support layer more preferably has a thickness of more than 100 μm. Further, although the maximum thickness of the polymer support layer is not limited, in order to uniformly form the polymer support layer, the polymer support layer preferably has a thickness not exceeding 5 mm.

In accordance with another aspect of the present invention, there is provided a method for manufacturing a nitride based light emitting device comprising forming a nitride based light emitting structure by sequentially stacking a first conduction-type nitride based semiconductor layer, an active layer, and a second conduction-type nitride based semiconductor layer on a preliminary substrate; forming a polymer support layer by applying a setting adhesive material having flowability on the upper surface of the nitride based light emitting structure and hardening the applied adhesive material; separating the nitride based light emitting structure from the preliminary substrate by irradiating a laser beam onto the lower surface of the preliminary substrate; bonding the light emitting structure to a conductive permanent substrate in such a manner that the separated surface of the light emitting structure serves as a bonding surface; removing the polymer support layer from the light emitting structure; and forming first and second electrodes on the upper surface of the light emitting structure and the lower surface of the permanent substrate, respectively.

Dividing the light emitting structure into the individual light emitting diodes of the present invention may be variously modified. In one embodiment, the method may further comprise cutting the light emitting structure into portions having a size corresponding to that of desired light emitting diodes, after the forming of the first and second electrodes.

Further, the method may further comprise partially cutting the light emitting structure into portions having a size corresponding to that of desired light emitting diodes, between the forming of the light emitting structure and the forming of the polymer support layer; and completely cutting the light emitting structure into portions having the size corresponding to that of the desired light emitting diodes, after the forming of the first and second electrodes.

In another embodiment, the method may further comprise partially cutting the light emitting structure into portions having a size corresponding to that of desired light emitting diodes, between the forming of the light emitting structure and the forming of the polymer support layer, wherein the light emitting structure is divided into individual light emitting diodes by removing the portion of the light emitting structure, which is not cut in the partially cutting of the light emitting structure, in the separating of the light emitting structure from the preliminary substrate. In this case, the portion of the light emitting structure, which is not cut in the partially cutting of the light emitting structure, has a thickness determined by the subsequent process.

That is, when the separating of the light emitting structure from the preliminary substrate is performed by a laser lift-off process, the portion of the light emitting structure, which is not cut in the partially cutting of the light emitting structure, preferably has a thickness of 5~500 mm. On the other hand, when the separating of the light emitting structure from the preliminary substrate is performed by dry or wet etching or lapping/polishing, the portion of the light emitting structure, which is not cut in the partially cutting of the light emitting structure, preferably has a thickness of more than 500 nm.

In case that the light emitting structure is partially or completely cut before the forming of the polymer support layer, the forming of the polymer support layer preferably includes applying the setting adhesive material so that grooves, which are formed in the light emitting structure in the partially cutting of the light emitting structure, are filled with the setting adhesive material. For this reason, the grooves, which are formed in the light emitting structure in the partially cutting of the light emitting structure, preferably have a width of 10~500 μm. When the width of the grooves is below 10 μm, it is difficult to fill the grooves with the adhesive material, and when the width of the grooves is above 500 μm, a loss area of a wafer is excessively increased.

In accordance with yet another aspect of the present invention, there is provided a method for manufacturing a nitride based light emitting device comprising forming a nitride based light emitting structure by sequentially stacking a first conduction-type nitride based semiconductor layer, an active layer, and a second conduction-type nitride based semiconductor layer on a preliminary substrate; cutting the nitride based light emitting structure into portions having a size corresponding to that of desired light emitting diodes; forming electrodes on the second conduction-type nitride based semiconductor layer; forming a polymer support layer by applying a setting adhesive material having flowability on the upper surface of the nitride based light emitting structure and hardening the applied adhesive material; separating the nitride based light emitting structure from the preliminary substrate by irradiating a laser beam onto the lower surface of the preliminary substrate; and removing the polymer support layer from the light emitting structure.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Now, preferred embodiments of the present invention will be described in detail with reference to the annexed drawings.

FIGS. 2A to 2E are sectional views for illustrating a method for manufacturing a nitride based single crystal in accordance with one embodiment of the present invention.

Figure 2A:
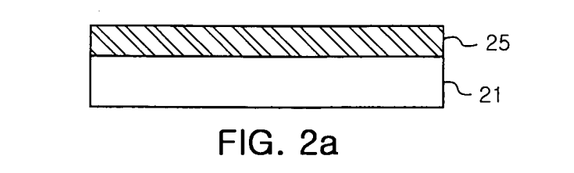
FIGS. 2A to 2E are sectional views for illustrating a method for manufacturing a nitride based single crystal in accordance with one embodiment of the present invention.

First, as shown in FIG. 2A, a nitride based single crystal layer 25 is formed on a preliminary substrate 21. The preliminary substrate 21 mainly uses a sapphire substrate. However, the preliminary substrate 21 is not limited thereto, and may use any substrate having a higher band gap than that of a nitride based single crystal. For example, the preliminary substrate 21 is made of one material selected from the group consisting of SiC, Si, $MgAl_2O_4$, MgO, $LiAlO_2$, and $LiGaO_2$. The nitride based single crystal layer 25 satisfies the molecular formula of $Al_xIn_yGa_{(1-x-y)}N$ (here, $0 \le x \le 1$, $0 \le y \le 1$, and $0 \le x+y \le 1$). The nitride based single crystal layer 25 is grown on the preliminary substrate 21 using hydride vapor phase epitaxy (HVPE), metal organic chemical vapor deposition (MOCVD), or molecular beam epitaxy (MBE). Since the growing of the nitride based single crystal layer 25 is performed at a high temperature of 900~1,200° C., the grown nitride based single crystal layer 25 is easily exposed to stress generating conditions when the nitride based single crystal layer 25 is cooled to the room temperature.

Figure 2B:
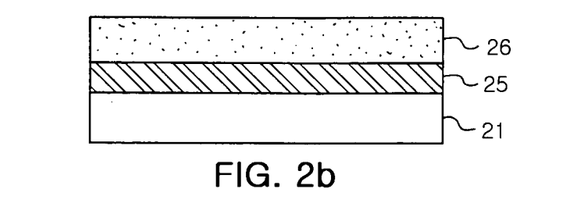

Thereafter, as shown in FIG. 2B, a setting adhesive material 26 having flowability is applied to the upper surface of the nitride based single crystal layer 25. Any material, which has flowability and is hardened under a predetermined condition so as to form a support structure, may be used as the setting adhesive material 26 of the present invention. For example, the setting adhesive material 26 is one selected from the group consisting of a thermosetting resin, an ultraviolet-setting resin, a naturally setting resin, and their mixtures, which can maintain a high adhesive strength with the preliminary substrate 21. Preferably, epoxy resin, which has a thermosetting property and a high adhesive strength with the nitride based single crystal layer 25, is used as the setting adhesive material 26. This setting adhesive material 26 having flowability is easily supplied to the upper surface of the nitride based single crystal layer 25 by the conventional application method, such as spin coating or hand printing.

Figure 2C:
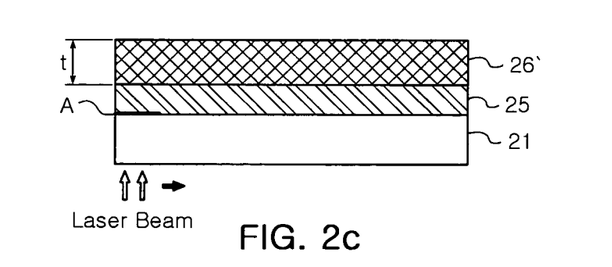

Thereafter, as shown in FIG. 2C, the applied adhesive material 26 is hardened, thereby forming a polymer support layer 26'. Here, a proper hardening process may be selected according to the hardening condition of the selected setting adhesive material 26. For example, when epoxy resin is used as the setting adhesive material 26, the setting adhesive material 26 is exposed to a proper temperature, thus forming the desired polymer support layer 26'. The polymer support layer 26', which contacts the nitride based single crystal layer 25, prevents crack and warpage of the nitride based single crystal layer 25 due to stress applied thereto, and allows the obtained nitride based single crystal layer 25 to be easily handled during or after the process. For this reason, the thickness (t) of the polymer support layer 26' is preferably at least 10 μm, and more preferably more than 100 μm in consideration of handling and a post-treatment. When the thickness (t) of the polymer support layer 26' exceeds 5 mm, it is difficult to achieve the uniform thickness (t) of the polymer support layer 26'. Accordingly, preferably, the thickness (t) of the polymer support layer 26' is less than 5 mm.

Figure 2D:
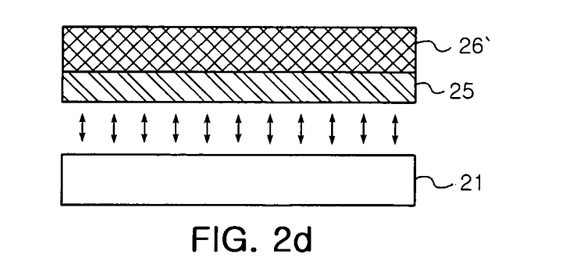

Thereafter, as shown in FIG. 2D, a laser beam is irradiated onto the lower surface of the preliminary substrate 21, thereby separating the nitride based single crystal layer 25 from the preliminary substrate 21. The irradiated laser beam has a wavelength corresponding to a band gap, which is smaller than that of the material of the preliminary substrate 21 and larger than that of the nitride based single crystal layer 25. For example, when a sapphire substrate is used as the preliminary substrate 21, a Nd-YAG laser beam having a wavelength of 355 nm is used. A region (A) of the preliminary substrate 21, onto which the laser beam is irradiated, is decomposed into nitrogen and metal, as described above. For example, when a gallium nitride (GaN) layer is formed, the gallium nitride layer is decomposed into metal, i.e., gallium (Ga), and nitrogen ($\frac{1}{2}N_2$). The laser beam is irradiated onto the whole area of the lower surface of the preliminary substrate 21 by a scanning method, and decomposes the interface region (A) of the nitride based single crystal layer 25 with the preliminary substrate, thereby separating the nitride based single crystal layer 25 from the preliminary substrate 21.

Figure 2E:
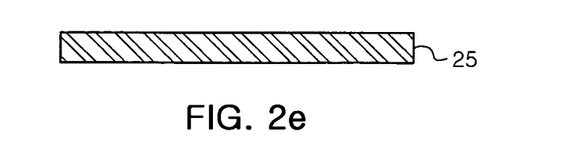

Finally, as shown in FIG. 2E, the polymer support layer 26' is removed from the nitride based single crystal layer 25. The nitride based single crystal layer 25, from which the polymer support layer 26' was removed, is referred to as the nitride based single crystal substrate 25. The polymer support layer 26' is easily removed using a proper solvent. The easy of removing the polymer support layer 26 is an advantage of the present invention. The proper solvent is one selected from the group consisting of various organic solvents and hot water according to the material of the polymer support layer 26'. If necessary, the process for removing the polymer support layer 26' from the nitride based single crystal layer 25 may be omitted, and the polymer support layer 26' may be maintained until the nitride based single crystal substrate 25 is supplied to a final user. That is, the polymer support layer 26' assures the safe handling of the obtained single crystal substrate 25. Since the polymer support layer 26' is easily removed by a simple process, the polymer support layer 26' serves as a support member until the nitride based single crystal substrate 25 is supplied to the final user.

FIGS. 3A to 3H are sectional views for illustrating a method for manufacturing a nitride based light emitting device in accordance with one embodiment of the present invention. Those skilled in the art will appreciated that the method of FIGS. 2A to 2E can be applied to a process for manufacturing a nitride based light emitting device.

Figure 3A:
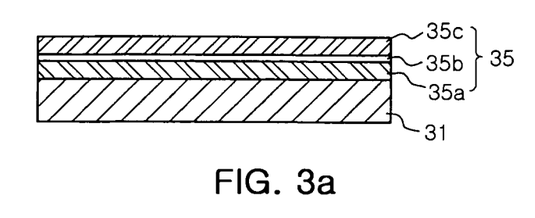
FIGS. 3A to 3H are sectional views for illustrating a method for manufacturing a nitride based light emitting device in accordance with one embodiment of the present invention.

First, as shown in FIG. 3A, a first conduction-type nitride based semiconductor layer 35a, an active layer 35b, and a second conduction-type nitride based semiconductor layer 35c are sequentially stacked on a preliminary substrate 31. The first conduction-type nitride based semiconductor layer 35a, the active layer 35b, and the second conduction-type nitride based semiconductor layer 35c form a desired nitride based light emitting structure 35.

Figure 3B:
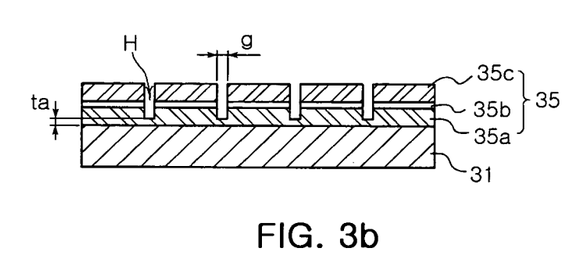

Thereafter, as shown in FIG. 3B, the light emitting structure 35 is partially cut into portions having a size corresponding to that of individual light emitting diodes. In this embodiment of the present invention, this cutting process is a preliminary cutting process out of various cutting processes. Cutting grooves (H) serve to relieve stress generated during the laser lift-off process. Further, a setting adhesive material 36 (in FIG. 3C), which will be applied in a subsequent process, fills the cutting grooves (H), and is hardened, thereby forming a polymer support layer 36' (in FIG. 3C) more firmly connected to the nitride based light emitting structure 35. For this reason, the width of the cutting grooves (H), i.e., the cutting width (g), is preferably 10~500 μm. When the cutting width (g) is below 10 μm, it is difficult to fill the cutting grooves (H) with the adhesive material 36, and when the cutting width (g) is above 500 μm, a loss area of a wafer is excessively increased.

Figure 3C:
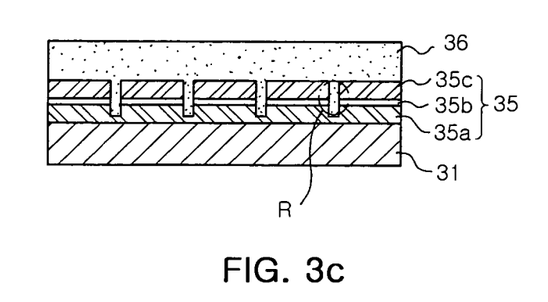

Thereafter, as shown in FIG. 3C, the setting adhesive material 36 having flowability is applied to the upper surface of the nitride based light emitting structure 35. As described above, the setting adhesive material 36 has flowability, thus being capable of filling the cutting grooves (H). The setting adhesive material 36 is one selected from the group consisting of a thermosetting resin, an ultraviolet-setting resin, a naturally setting resin, and their mixtures, which can maintain a high adhesive strength with the preliminary substrate 31. Preferably, epoxy resin, which has a thermosetting property, is used as the setting adhesive material 36. This setting adhesive material 36 is easily supplied to the upper surface of the nitride based light emitting structure 35 by the conventional application method, such as spin coating or hand printing.

Figure 3D:
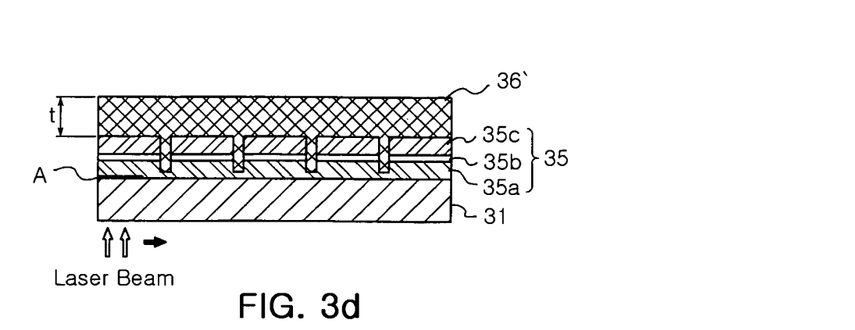

Thereafter, as shown in FIG. 3D, the adhesive material 36 is hardened, thereby forming the polymer support layer 36'. Here, a proper hardening process may be selected according to the hardening condition of the selected setting adhesive material 36. The polymer support layer 36', which contacts the nitride based light emitting structure 35, prevents cracks and warpage of the nitride based light emitting structure 35 due to stress applied thereto, and allows the nitride based light emitting structure 35 to be easily handled during the process. For this reason, the thickness (t) of the polymer support layer 36' is preferably at least 10 μm, and more preferably more than 100 μm in consideration of supporting and handling. Further, so as to uniformly form the polymer support layer 36', preferably, the thickness (t) of the polymer support layer 36' does not exceed 5 mm. In this embodiment, the polymer support layer 36' is formed up to the surfaces of the cutting grooves (H), thus having a higher adhesive strength.

Figure 3E:
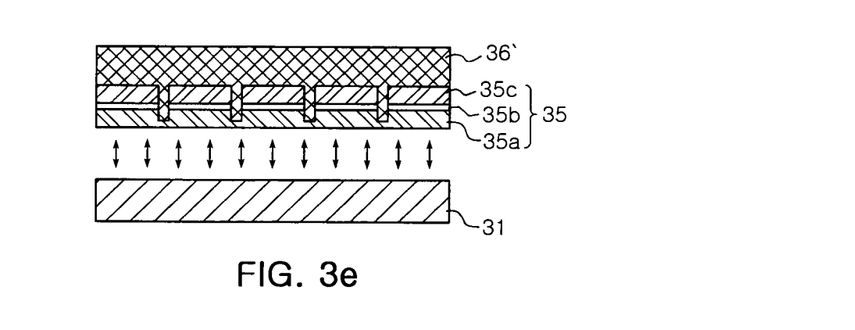

Thereafter, as shown in FIG. 3E, a laser beam is irradiated onto the lower surface of the preliminary substrate 31, thereby separating the nitride based light emitting structure 35 from the preliminary substrate 31. As described above, the irradiated laser beam has a wavelength corresponding to a band gap, which is smaller than that of the material of the preliminary substrate 31 and larger than that of a nitride single crystal. Further, in this embodiment, when the partial cutting process, as shown in FIG. 3B, is employed, the thickness (ta) of the non-cut portion of the nitride based light emitting structure 35 is set to a proper value, thereby completely separating the nitride based light emitting structure 35 from the preliminary substrate 31. This facilitates a subsequent process for dividing the nitride based light emitting structure 35 into individual chips. That is, since the nitride based light emitting structure 35 having a high hardness is not cut during the subsequent individual chip dividing process, the subsequent individual chip separating process is more easily performed. As described above, in order to completely separate the nitride based light emitting structure 35 from the preliminary substrate 31 in the laser lift-off process, the thickness (ta) of the non-cut portion of the light emitting structure 35 is preferably 5~500 nm.

Figure 3F:
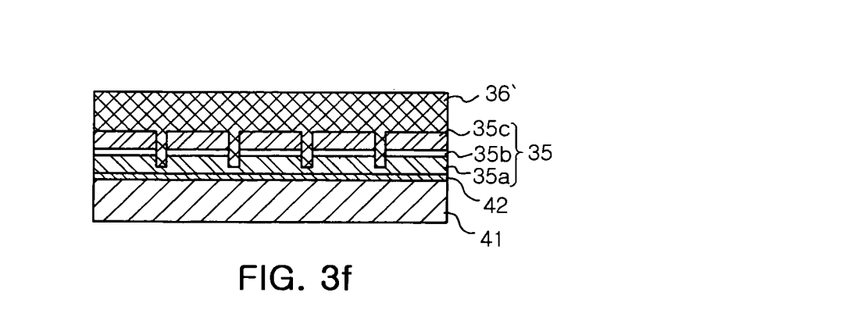

Thereafter, as shown in FIG. 3F, in order to use the separated surface of the light emitting structure 35 (i.e., the lower surface of the first conduction-type nitride based semiconductor layer 35a) as a bonding surface, the separated surface of the light emitting structure 35 is bonded to a permanent substrate 41. The permanent substrate 41 mainly uses a silicon substrate. However, the permanent substrate 41 is not limited thereto, and may be a substrate made of one conductive material selected from the group consisting of SiC, ZnO and GaAs. This bonding process is may be performed by thermocompression. In this embodiment, the bonding process is performed using a separate conductive adhesive layer 42. The conductive adhesive layer 42 is made of Au—Sn, Sn, Au—Ag, Ag—Cu, or Pb—Cu. In accordance with the present invention, the stack order of the first conduction-type nitride based semiconductor layer 35a, the active layer 35b, and the second conduction-type nitride based semiconductor layer 35c on the preliminary substrate 31 is also maintained on the permanent substrate 41. It is a technical difference between the method of the present invention and the conventional method disclosed in Korean Patent Registration No. 483049.

Figure 3G:
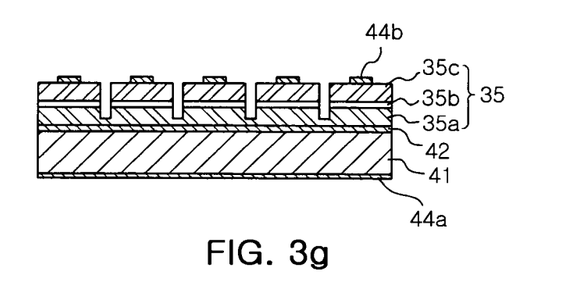

Thereafter, as shown in FIG. 3G, the polymer support layer 36' is removed from the nitride based light emitting structure 35, and first and second electrodes 44a and 44b are respectively formed on the lower surface of the permanent substrate 31 and the upper surface of the light emitting structure 35. The polymer support layer 36' is easily removed using a proper solvent. In this embodiment, although the cutting grooves are filled with the polymer support layer 36', the polymer support layer 36' is easily dissolved in the proper solvent, thus being completely removed. After the removal of the polymer support layer 36', the first and second electrodes 44a and 44b are respectively provided to the lower surface of the permanent substrate 31 and the upper surface of the light emitting structure 35, as shown in FIG. 3G. In order to dispose an n-type nitride based semiconductor, layer facilitating formation of Ohmic contact on the upper portion of the light emitting structure 35, in the process of FIG. 3A, a p-type nitride based semiconductor layer, an active layer, and the n-type nitride based semiconductor layer are sequentially stacked. In this embodiment of the present invention, the initial stack order of the layers can be maintained, and thus is equal to the final stack order of the layers.

Figure 3H:
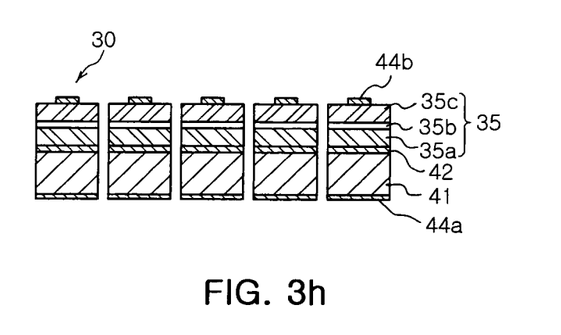

Finally, as shown in FIG. 3H, the obtained structure is completely divided into individual light emitting diodes 30. In this embodiment, the light emitting structure 35 and the permanent substrate 41 are completely divided into the light emitting diodes 30 along the partially cutting grooves (H). However, this dividing process may be variously modified. For example, the partial cutting process of FIG. 3B is not employed, and the light emitting structure 35 is completely divided into the individual light emitting diodes 30 after the first and second electrodes 44a and 44b are formed. On the other hand, after only the light emitting structure 35 is divided into portions corresponding to the light emitting diode 30 in the process of FIG. 3B or the non-cut portion of the light emitting structure 35 is removed in the laser lift-off process of FIG. 3D, the permanent substrate 41 is divided into portions corresponding to the light emitting diodes 30 in this process.

A method for manufacturing a nitride based light emitting device of the present invention may not employ a conductive permanent substrate. In this case, the obtained nitride based light emitting device may include a nitride based single crystal structure without a substrate.

FIGS. 4A to 4E are sectional views for illustrating a method for manufacturing a nitride based light emitting device in accordance with another embodiment of the present invention.

Figure 4A:
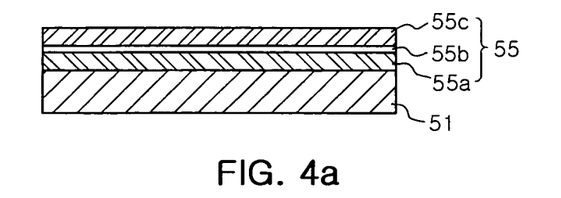
FIGS. 4A to 4E are sectional views for illustrating a method for manufacturing a nitride based light emitting device in accordance with another embodiment of the present invention.

First, as shown in FIG. 4A, a first conduction-type nitride based semiconductor layer 55a, an active layer 55b, and a second conduction-type nitride based semiconductor layer 55c are sequentially stacked on a preliminary substrate 51. The first conduction-type nitride based semiconductor layer 55a, the active layer 55b, and the second conduction-type nitride based semiconductor layer 55c form a desired nitride based light emitting structure 55.

Figure 4B:
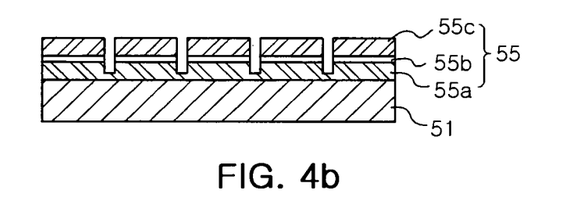

Thereafter, as shown in FIG. 4B, the light emitting structure 55 is cut into portions having a size corresponding to that of individual light emitting diodes. This cutting process may be a completely cutting process or a preliminary cutting process. In this embodiment, the cutting process is a preliminary cutting process, in which a portion of the light emitting structure 55 having a designated thickness, which can be removed by a subsequent laser lift-off process, remains. Here, cutting grooves serve to relieve stress generated during the laser lift-off process. Preferably, the width of the cutting grooves, i.e., the cutting width (g), is preferably 10~500 μm.

Figure 4C:
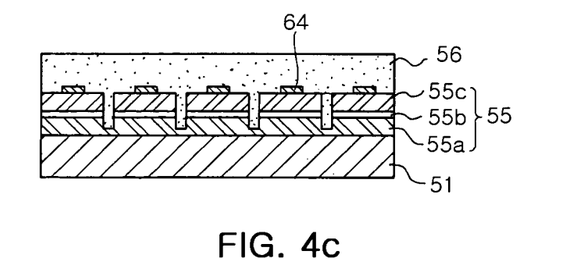

Thereafter, as shown in FIG. 4C, electrodes 64 are formed on the upper surface of the second conduction-type nitride based semiconductor layer 55c, and a setting adhesive material 56 having flowability is applied to the upper surface of the nitride based light emitting structure 55. In this embodiment, the electrodes 64 are formed on the nitride based light emitting structure 55 before the setting adhesive material 56 is applied to the nitride based light emitting structure 55. Since the second conduction-type nitride based semiconductor layer 55c is generally a p-type nitride based semiconductor layer, the electrodes 64 having shapes appropriate for formation of Ohmic contact are employed. As described above, the setting adhesive material 56 has flowability, thus being capable of filling the cutting grooves (H). The setting adhesive material 56 is easily supplied to the upper surface of the nitride based light emitting structure 55 by the conventional application method, such as spin coating or hand printing.

Figure 4D:
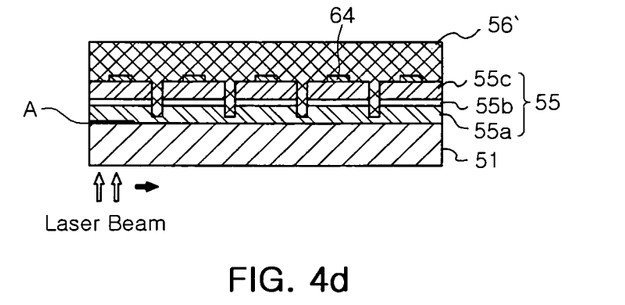

Thereafter, as shown in FIG. 4D, the adhesive material 56 is hardened, thereby forming a polymer support layer 56'. Here, a proper hardening process may be selected according to the hardening condition of the selected setting adhesive material 56. The polymer support layer 56', which contacts the nitride based light emitting structure 55, prevents cracks and warpage of the nitride based light emitting structure 55 due to stress applied thereto, and allows the nitride based light emitting structure 55 to be easily handled during the process. For this reason, the thickness (t) of the polymer support layer 56' is preferably at least 10 μm, and more preferably more than 100 μm in consideration of supporting and handling. Further, so as to uniformly form the polymer support layer 56', preferably, the thickness (t) of the polymer support layer 56' does not exceed 5 mm.

Figure 4E:
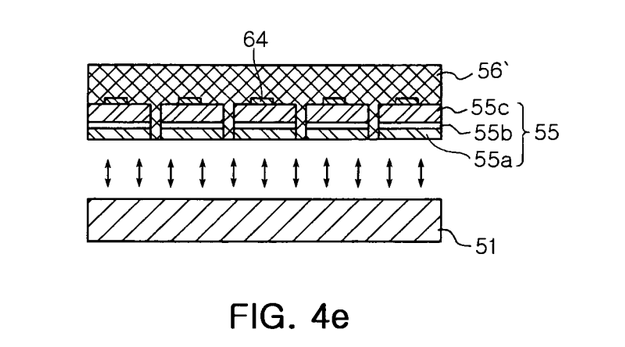

Thereafter, as shown in FIG. 4E, a laser beam is irradiated onto the lower surface of the preliminary substrate 51, thereby separating the nitride based light emitting structure 55 from the preliminary substrate 51. As described above, the irradiated laser beam has a wavelength corresponding to a band gap, which is smaller than that of the material of the preliminary substrate 51 and larger than that of a nitride based single crystal. Further, in this embodiment, the non-cut portion of the nitride based light emitting structure 55 is removed by this laser lift-off process, thereby completely separating the light emitting structure 55 from the preliminary substrate 51. This facilitates a subsequent process for dividing the light emitting structure 55 into individual chips. As described above, in order to completely separate the nitride based light emitting structure 55 from the preliminary substrate 51 in the laser lift-off process, the thickness (ta) of the non-cut portion of the light emitting structure 55 is preferably 5~500 nm.

The cut portions of the light emitting structure 55 may be used as light emitting diodes under the condition that the cut portions are not bonded on a permanent substrate. In this case, any separate electrode need not be formed on the first conduction-type nitride based semiconductor layer 55a. That is, when the first conduction-type nitride based semiconductor layer 55a is an n-type semiconductor layer facilitating formation of Ohmic contact, the cut portions of the light emitting structure 55 are mounted directly on electrode pads of a board, such as a package substrate or a printed circuit board.

The polymer support layer 56' is easily removed using a proper solvent, such as one of various organic solvents or hot water. In this embodiment, since the light emitting structure 55 is not supported by a substrate, the polymer support layer 56' has a comparatively large thickness of at least 100 μm, thereby allowing the individual light emitting diodes to be easily handled.

As apparent from the above description, the present invention provides a method for manufacturing a nitride based single crystal substrate and a method for manufacturing a nitride based light emitting device, in which a support layer contacting the nitride based single crystal substrate and the nitride based light emitting device is formed by depositing a setting adhesive material having flowability, thereby preventing the generation of cracks and warpage due to stress and being easily handled during or after a process.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for manufacturing a nitride based single crystal substrate comprising:
    forming a nitride based single crystal layer on an upper surface of a preliminary substrate;
    forming a polymer support layer directly contacting the nitride based single crystal layer by:
        applying a resin having flowability on an upper surface of the nitride based single crystal layer;
        hardening the applied resin while an upper surface of the applied resin is exposed to form a structure with the polymer support layer as the uppermost layer of the structure;
    irradiating a laser beam onto a lower surface of the preliminary substrate of the structure while the polymer support layer is the uppermost layer of the structure; and
    separating the nitride based single crystal layer from the preliminary substrate after irradiating the laser beam onto the lower surface of the preliminary substrate,
    wherein the polymer support layer has a thickness of 0.01~5 mm.

2. The method according to claim 1, further comprising removing the polymer support layer from the nitride based single crystal layer.

3. The method according to claim 1, wherein the preliminary substrate is made of a material having an energy band gap larger than that of the nitride based single crystal layer.

4. The method according to claim 3, wherein the preliminary substrate is made of one material selected from the group consisting of sapphire, SiC, Si, $MgAl_2O_4$, MgO, $LiAlO_2$, and $LiGaO_2$.

5. The method according to claim 1, wherein the applying of the resin is performed by spin coating or hand printing.

* * * * *